United States Patent
Khidre et al.

(10) Patent No.: US 10,651,892 B1
(45) Date of Patent: May 12, 2020

(54) STRUCTURES FOR CROSS-TALK REDUCTION

(71) Applicant: Keyssa Systems, Inc., Campbell, CA (US)

(72) Inventors: Ahmed Khidre, Campbell, CA (US); Mohamed Sameh Mahmoud, Sunnyvale, CA (US); Eric Sweetman, Portland, OR (US)

(73) Assignee: Keyssa Systems, Inc., Campbell, CA (US)

( * ) Notice: Subject to any disclaimer, the term of this patent is extended or adjusted under 35 U.S.C. 154(b) by 0 days.

(21) Appl. No.: 16/560,524

(22) Filed: Sep. 4, 2019

Related U.S. Application Data

(63) Continuation of application No. 15/398,588, filed on Jan. 4, 2017, now Pat. No. 10,454,526.

(51) Int. Cl.
    *H04M 1/00*    (2006.01)
    *H04B 3/32*    (2006.01)
    *H04M 1/02*    (2006.01)
    *H05K 9/00*    (2006.01)

(52) U.S. Cl.
    CPC ............ *H04B 3/32* (2013.01); *H04M 1/0277* (2013.01); *H05K 9/002* (2013.01)

(58) Field of Classification Search
    CPC ........ H04B 3/32; H04M 1/0277; H05K 9/002
    See application file for complete search history.

(56) References Cited

U.S. PATENT DOCUMENTS

| | | | | |
|---|---|---|---|---|
| 9,490,874 | B2 * | 11/2016 | McCormack | H04B 5/0031 |
| 2012/0263244 | A1 * | 10/2012 | Kyles | H01L 23/49861 |
| | | | | 375/259 |
| 2014/0106680 | A1 * | 4/2014 | McCormack | H04W 12/06 |
| | | | | 455/63.1 |
| 2015/0111496 | A1 * | 4/2015 | McCormack | H04B 5/0031 |
| | | | | 455/41.1 |
| 2015/0226962 | A1 * | 8/2015 | Kashdan | G02B 5/281 |
| | | | | 427/9 |
| 2016/0197630 | A1 * | 7/2016 | Kawasaki | H01P 3/121 |
| | | | | 455/73 |

OTHER PUBLICATIONS

Tsutsumi, M. et al. Reflection of Millimeter Waves by a Corrugated Dielectric Slab Waveguide. Proceedings of the IEEE, vol. 68, No. 6. Published Jun. 1980, 2 pages.
Young Chul Lee, A Fully Embedded 60-GHz Novel BPF for LTCC System-in-Package Applications, 29, No. 4, Nov. 2006, IEEE, 6 pages.

* cited by examiner

*Primary Examiner* — Xin Jia
(74) *Attorney, Agent, or Firm* — Fish & Richardson P.C.

(57) ABSTRACT

Systems and apparatuses for electromagnetic communications are provided. One of the apparatuses includes a housing portion for an electronic device, wherein the housing portion comprises: a first region formed from a first material; and a second region comprising an arrangement of structures formed from the first material and a second material, wherein the arrangement of structures reduce propagation of electromagnetic radiation propagating through the second region.

18 Claims, 12 Drawing Sheets

STRUCTURES FOR CROSS-TALK REDUCTION

CROSS-REFERENCE TO RELATED APPLICATIONS

This application is a continuation of and claims the benefit of priority to U.S. patent application Ser. No. 15/398,588, filed on Jan. 4, 2017, the contents of which are hereby incorporated by reference.

BACKGROUND

This specification relates to electromagnetic communications. Advances in semiconductor manufacturing and circuit design technologies have enabled the development and production of integrated circuits (ICs) with increasingly higher operational frequencies. In turn, electronic products and systems incorporating high frequency integrated circuits are able to provide greater functionality than previous generations of products. The additional functionality has typically included the processing of increasingly larger amounts of data at increasingly higher speeds.

Many conventional electronic systems include multiple printed circuit boards (PCBs) upon which ICs are mounted, and through which various signals are routed to and from the ICs. Connecting to PCBs by conventional means, e.g., signal-carrying mechanical connectors, generally creates discontinuities, requiring expensive electronics to negotiate. Conventional mechanical connectors may also wear out over time, require precise alignment and manufacturing methods, and are susceptible to mechanical jostling.

Communication channels can be formed between one or more transmitter integrated circuit package of one device and one or more corresponding receiver integrated circuit package of another device. Communication signals of a particular communication channel intended for a particular receiver integrated circuit can leak to one or more other communication channels, resulting in cross-talk interference.

SUMMARY

The devices and methods disclosed herein allow for reduced cross-talk between communication channels. A communication channel can be formed between a transmitter integrated circuit package of one device and a receiver integrated circuit package of another device. Transmitter integrated circuit packages and receiver integrated circuit packages can also be referred to as connectors. Cross-talk can occur internally within a single device when signals intended for transmission outside the device is received by the receiver of the device.

The devices and methods disclosed herein can reduce a material volume of the devices compared to systems that use distance or absorber structures to isolate the devices and/or individual communication channels. A wide range of materials can be selected to be incorporated into the devices to reduce cross-talk, allowing flexible implementation of the methods and devices disclosed herein, simplifying their fabrication. Some examples of materials that can be chosen include plastics, zirconia, and other insulating materials. For example, structures can be implanted within housing/cases of devices.

In general, one innovative aspect of the subject matter described in this specification can be embodied in apparatuses that include a housing portion for an electronic device, wherein the housing portion includes: a first region formed from a first material; and a second region including an arrangement of structures formed from the first material and a second material, wherein the arrangement of structures reduce propagation of electromagnetic radiation propagating through the second region.

The foregoing and other embodiments can each optionally include one or more of the following features, alone or in combination. In particular, one embodiment includes all the following features in combination. The arrangement of structures includes a periodic arrangement of the first material and the second material. The housing portion of the housing including the arrangement of structures has a planar exterior surface. The housing portion is configured to be placed over a first connector, the first region is vertically above the first connector, the first connector is configured to transmit electromagnetic radiation through the first region, and the arrangement of the structures comprises multiple concentric circles surrounding the first region. The housing portion is configured to be placed over multiple connectors, the multiple connectors are configured to transmit electromagnetic radiation through the first portion, and the arrangement of the structures is disposed in regions of the housing portion that are above gaps between the multiple connectors. Multiple holes, slots, or trenches are defined in the first material of the top portion of the housing, and the second material fills the multiple holes to form the arrangement of structures. Multiple slots are defined in the first material, the top portion has a first width and a first length, and the multiple slots extend across the width of the housing portion. A width of the slot filled with the second material is a quarter of a wavelength of the electromagnetic radiation in the second material, and a dimension of a distance between slots in the multiple slots is a quarter of a wavelength of the electromagnetic radiation in the first material. The arrangement of structures is configured to filter electromagnetic radiation having a wavelength between 50 GHz to 70 GHz. A bandwidth of the filter is less than 60%. Multiple holes, slots, or trenches filled with the second material are formed integrally with the housing portion by injection molding. The first material includes plastic and the second material includes foam. The electromagnetic radiation is between 50 to 70 GHz and the arrangement of structures reduces a transmission between a first end of the second region and a second end of the second region by more than 40% over a bandwidth of 5 GHz. The arrangement of structures formed from the first material and the second material includes multiple structures having one or more different shapes and/or one or more different distances between the multiple structures. The arrangement of the structures includes multiple structures having different heights. The arrangement of structures includes structures that have heights smaller than a thickness of the housing.

In general, one innovative aspect of the subject matter described in this specification can be embodied in communications modules that include a transmitter integrated circuit package, a receiver integrated circuit package; a housing enclosing the transmitter integrated circuit package and the receiver integrated circuit package, wherein the housing includes a first material that permits electromagnetic radiation to be transmitted from the transmitter integrated circuit package enclosed by the housing through the housing; and multiple structures formed of a second material different from the first material defined in a region of the housing configured to reduce propagation of electromagnetic signals within the housing, wherein the structures are positioned in the region such that a propagation path through the housing of an electromagnetic signal from the transmitter integrated circuit package to the receiver integrated circuit package crosses one or more of the multiple structures.

The foregoing and other embodiments can each optionally include one or more of the following features, alone or in combination. The communication module further includes an absorber structure, and a printed circuit board on which the transmitter integrated circuit package and the receiver integrated circuit package are mounted, wherein the multiple structures formed of the second material are configured to reduce cross-talk between the transmitter integrated circuit package and the receiver integrated circuit package. The communication module is configured to establish a communication channel when a second communication module is placed in proximity to the communication module, and wherein the communication channel is between a transmitter integrated circuit package of the second communication module and the receiver integrated circuit package of the communication module, or between a receiver integrated circuit package of the second communication module and the transmitter integrated circuit package of the communication module. The multiple structures formed of a second material include a periodic arrangement of the first material and the second material. Multiple holes, slots, or trenches are defined in the first material of the housing, and the second material fills the multiple holes to form the arrangement of structures. The housing including the multiple structures has a planar exterior surface. Multiple slots are defined in a portion of the housing, the housing having a first width and a first length, and the multiple slots extend across the width of the housing. A width of the slot filled with the second material is a quarter of a wavelength of the electromagnetic radiation in the second material, and a dimension of a distance between slots in the multiple slots is a quarter of a wavelength of the electromagnetic radiation in the first material. The multiple structures are configured to filter electromagnetic radiation having a wavelength between 50 GHz to 70 GHz.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference symbols in the various drawings indicate like elements.

DETAILED DESCRIPTION

Figure 1:
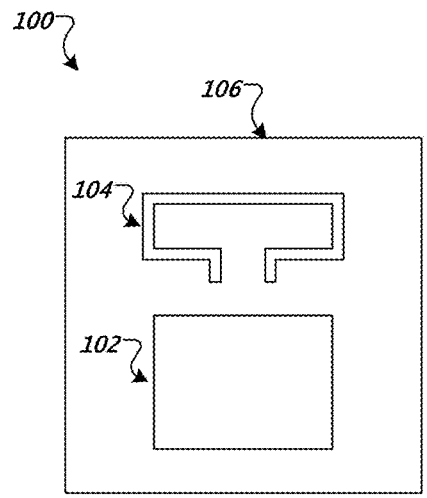
FIG. 1 is an overhead view of an example IC package.

This specification describes electromagnetic (EM) blocking structures for contactless communication. In particular, this specification describes the use of signal blocking structures that introduce discontinuities to reduce cross-talk between communication channels.

Contactless communication may be used to provide signal communications between components on a device or may provide communication between devices. In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may not be contiguous with respect to each other. In some examples, the transmitter and receiver may be disposed on separate circuit carriers positioned with the antennas of the transmitter/receiver pair in close proximity. This specification describes a number of different structures that can be employed to reduce or block stray signals leaking from a transmitter associated with a first communication channel to a receiver of another communication channel.

Contactless communication A transmitter and/or receiver may be configured as an integrated circuit (IC) package, in which one or more antennas may be positioned adjacent to a die and held in place by a dielectric or insulating encapsulation or bond material. An antenna may also be held in place by a lead frame substrate. Examples of antennas embedded in IC packages are shown in the drawings and described below. Note that IC packages may also be referred to as simply packages, and are examples of contactless communication units that are also variously referred to as communication units, communication devices, comm-link chips, comm-link chip assemblies, comm-link chip packages, and/or comm-link packages, which may be configured in various ways. For example, IC packages, communication units, communication devices, comm-link chips, comm-link chip assemblies, comm-link chip packages, and/or comm-link packages may each include one or more ICs, chips, or dies and have circuit functionality appropriate for particular applications.

FIG. 1 shows an example IC package 100. The IC package 100 includes a die 102 and a transducer 104 providing conversion between electrical and electromagnetic (EM) signals. The IC package 100 may include additional structures, for example, conductive connectors, such as bond wires, electrically connecting the transducer to bond pads connected to a transmitter or receiver circuit included in die 102. The IC package 100 further includes an encapsulating material 106 formed around at least a portion of the die 102 and/or the transducer 104. In the example IC package 100, the encapsulating material 104 completely covers the die 100 and the transducer 104.

The die 102 includes any suitable structure configured as a circuit on a suitable die substrate. In some implementations, the die can alternatively be referred to as a chip or an integrated circuit. The die substrate may be composed of any suitable semiconductor material, for example, silicon. In some implementations, the die 102 has a length and a width dimension each of substantially 1.0 mm to about 2.0 mm. The die 102 may be mounted with electrical conductors, such as a lead frame, not shown in FIG. 1, electrically coupling the die 102 to one or more external circuits. The IC package 100 can further include a transformer to provide impedance matching between a circuit on the die 102 and the transducer 104.

The transducer 104 may be in the form of a folded dipole, patch antenna, bow tie antenna, loop antenna, or other types of antennas, and is configured to transmit and/or receive electromagnetic signals. In some implementations, the antenna is configured to operate at radio frequencies including radio frequencies in the extremely high frequency (EHF) band of the electromagnetic spectrum, e.g., frequencies from 30 to 300 gigahertz. As shown in IC package 100, the antenna is separate from the die 102, but is coupled to the die 102 by suitable conductors, not shown.

The dimensions of the antenna are determined such that they are suitable for operation in the specified frequency band of the electromagnetic spectrum, e.g., the EHF band.

In one example, a loop configuration of the antenna can be configured to include a substantially 0.1 mm band of material, laid out in a loop substantially 1.4 mm long and substantially 0.53 mm wide, with a gap of substantially 0.1 mm at the mouth of the loop, and with the edge of the loop approximately 0.2 mm from the edge of die 102.

The encapsulating material 106 can be used to assist in holding the various components of IC package 100 in fixed relative positions. The encapsulating material 106 may be formed from a suitable material configured to provide electrical insulation and physical protection for the components of IC package 100. Additionally, the encapsulating material 106 can be selected from a material that does not impede, or that optimizes passage of, signals to or from the transducer 104. For example, the encapsulating material 106 can be composed of glass, plastic, or ceramic. The encapsulating material 106 may also be formed in any suitable shape. For example, the encapsulating material 106 may be in the form of a rectangular block, encapsulating all components of the IC package 100 except for any unconnected ends of conductors connecting the die 102 to external circuits.

Figure 2:
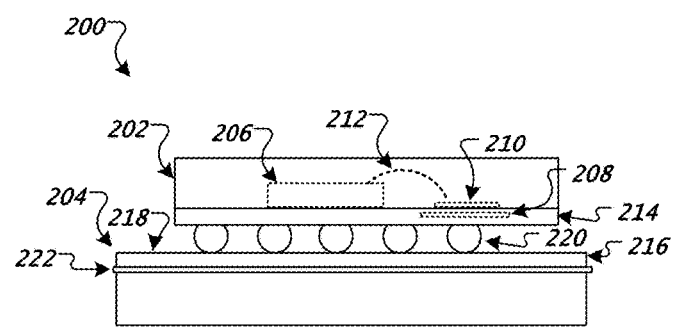
FIG. 2 shows a side view representation of an example communication device including an IC package.

FIG. 2 shows a side view representation of an example communication device 200 including an IC package 202 mounted to a PCB 204. The IC package 202 includes a die 206, a ground plane 208, an antenna 210, and one or more bond wires 212 connecting the die 206 to the antenna 210. The die 206 and antenna 210 are mounted on a package substrate 214 and encapsulated in an encapsulating material. The ground plane 208 is within the package substrate 214 and is a suitable structure configured to provide an electrical ground for the antenna 210. The ground plane 208 can extend the entire length of the package substrate 214 or just a portion, in particular, a portion underneath the antenna 210. The PCB 204 includes a top dielectric layer 216 having a surface 218. The IC package 202 is mounted to the surface 218 with mounting bumps 220 attached to a metallization pattern (not shown).

The PCB 204 also optionally includes a layer 222 spaced from dielectric layer 216 made of conductive material forming a ground plane within the PCB 204. The PCB ground plane may be any suitable structure configured to provide an electrical ground to circuits and components on the PCB 204.

Figure 3:
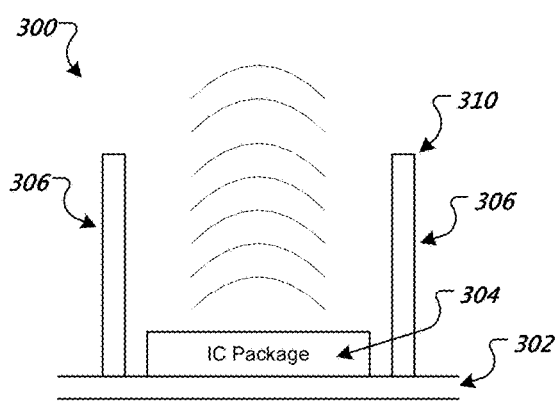
FIG. 3 is a side view of an example communication module including a signal guiding structure.

FIG. 3 is a side view of an example communication module 300 including a signal guiding structure. As shown in FIG. 3, the communication module 300 includes a PCB 302, an IC package 304, and a signal guiding structure 306 providing a signal pathway. The communication module 300, can include a transmitter or receiver for transmitting or receiving signals, e.g., radio frequency signals.

In particular, the IC package 304 can correspond to the IC packages described above with respect to FIGS. 1 and 2. The IC package 304 is mounted on the PCB 302. For example, the IC package 304 can be mounted to the PCB as described with respect to FIG. 2.

The communication module 300 can be configured to transmit or receive data using radio frequency communication. For example, if the communication module 300 includes a transmitter, the communication module 300 can transmit data, which can then be received by a receiver, e.g., of another communication module.

The signal guiding structure 306 is configured to aid in directing radio frequency (RF) signals as well as to reduce interference from signals. The signal guiding structure 306 can surround a perimeter of the IC package and extend in the direction of signal transmission and/or reception by a specified amount to provide a channel for emitted or received RF signals. For example, the signal guiding structure 306 can have a height 310 suitable for a particular device including the communication module 300 and that allows the signal guiding structure 306 to be positioned in proximity to a corresponding signal guiding structure of another communication module when used to communicate with another device. The signal guiding structure can be composed of a suitable material that is configured to reduce extraneous signals without disrupting passage of communications along the channel formed by the signal guiding structure 306.

FIG. 3 illustrates one IC package 304 mounted to the PCB 302. However, in other implementations, more than one IC package can be mounted to the same PCB 302.

The communication module 300 can be part of a communication system of a device, e.g., a computer, mobile phone, tablet, kiosk, or other device/system. The communication system can be configured to provide contactless communication using one or more IC packages. For example, the communication system can include two IC packages, one configured as a transmitter and the other configured as a receiver. The communication system can be in communication with a storage device. Thus, for example, the communication system can transfer data between the data storage unit and an external device using contactless communication provided by the IC packages.

Figure 4:
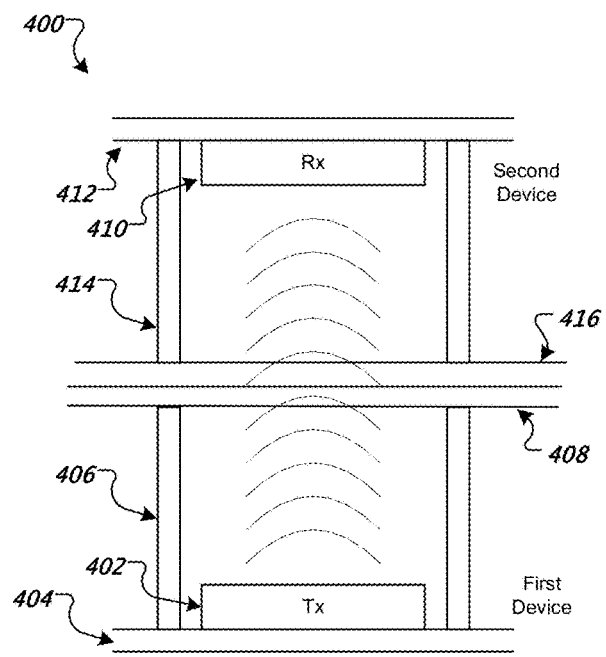
FIG. 4 is a side view diagram illustrating an example of communication between a transmitter and a receiver.

FIG. 4 is a side view diagram 400 illustrating an example of communication between a transmitter and a receiver. For example, a user of a first device may wish to exchange data with a second device. The two devices can be positioned in proximity to each other such that the respective communication modules for transmitting and receiving data are aligned and in range of each other. In particular, for EHF frequencies, the transmitter and receiver of the two devices may need to be within specified distances. The distances can vary, for example, depending on the particular frequencies used, the materials between the transmitter and receiver, and the strength of the transmission.

In FIG. 4, a first device includes a first communication module having a transmitter IC package 402 positioned on a first PCB 404. The transmitter IC package 402 is surrounded by a first signal guiding structure 406 forming a channel. The first signal guiding structure 406 extends to a surface of a first housing 408 of the first device. For example, the first device can be a first mobile phone and the first housing 408 can correspond to the outer case of the first mobile phone.

A second device includes a second communication module having a receiver IC package 410 positioned on a second PCB 412. The receiver IC package 410 is surrounded by a second signal guiding structure 414 forming a channel. The second signal guiding structure 414 extends to a surface of a second housing 416 of the second device. For example, the second device can be a second mobile phone and the second housing 416 can correspond to the outer case of the second mobile phone.

As illustrated by diagram 400, the first signal guiding structure 406 and the second signal guiding structure 414 are aligned and an outer surface of the first housing 408 and the second housing 416 are in physical contact to provide optimal communication distance and interference.

A data transmission from the transmitter IC package 402 passes through the channel formed by the first signal guiding structure 406 and the second signal guiding structure 414 to the receiver IC package 410. For example, a pair of devices can communicate data between each other by transmitting data from the transmitter IC package 402 to the receiver IC package 410. The signal guiding structures along with a proper alignment can maximize the power of the transmission that is received by the receiver IC package. In some implementations, the signal guiding structures can be formed from, or include a layer of, a metallic material that reflects the transmitted data along the signal guiding structures toward the receiver. In some other implementations, the signal guiding structures can be formed from, or include a layer of, an electromagnetic absorbing material to reduce stray signals that may cause interference.

Although transmitted signals from a transmitter are intended for receipt by a particular receiver, cross talk caused by leaking of signal to another channel can result in unintended coupling that interferes with communication on that other channel. Example sources of cross-talk are illustrated in FIGS. 5A and 6.

Sources of Cross-Talk

Figure 5A:
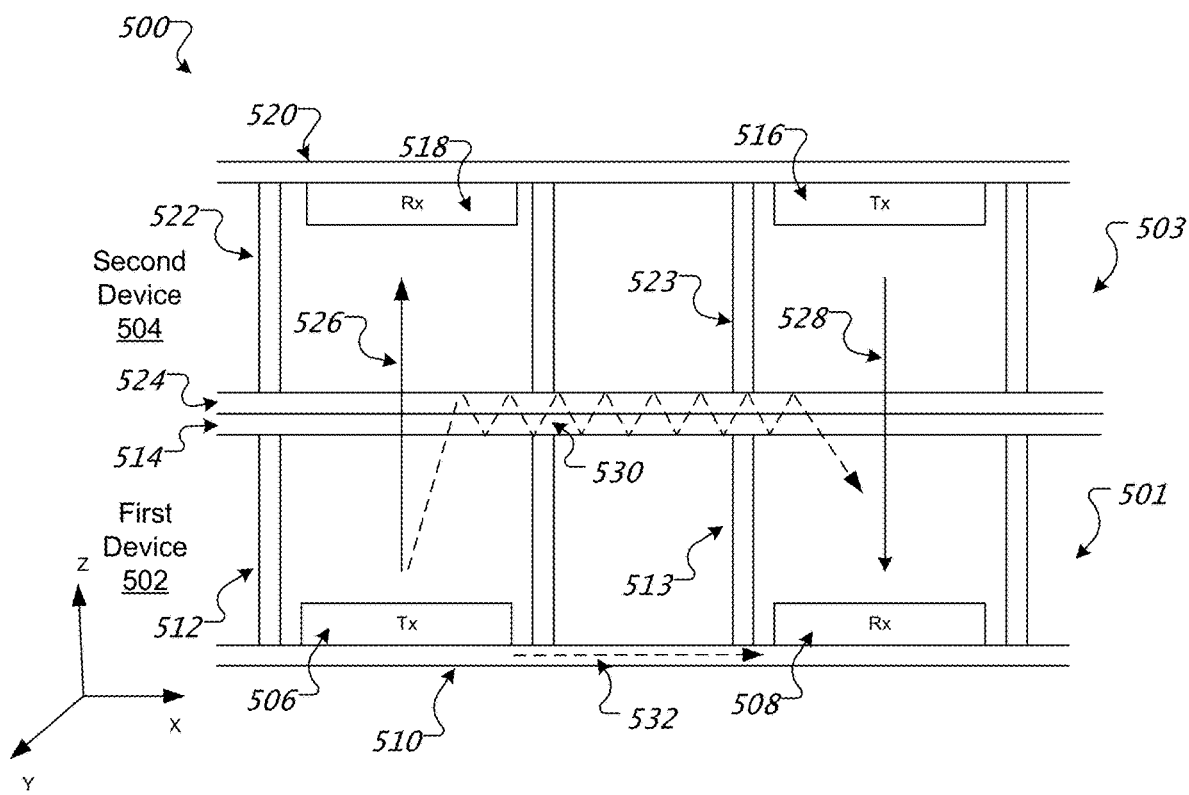
FIG. 5A shows a side view diagram illustrating an example of communication between a pair of communication modules.
Figure 6:
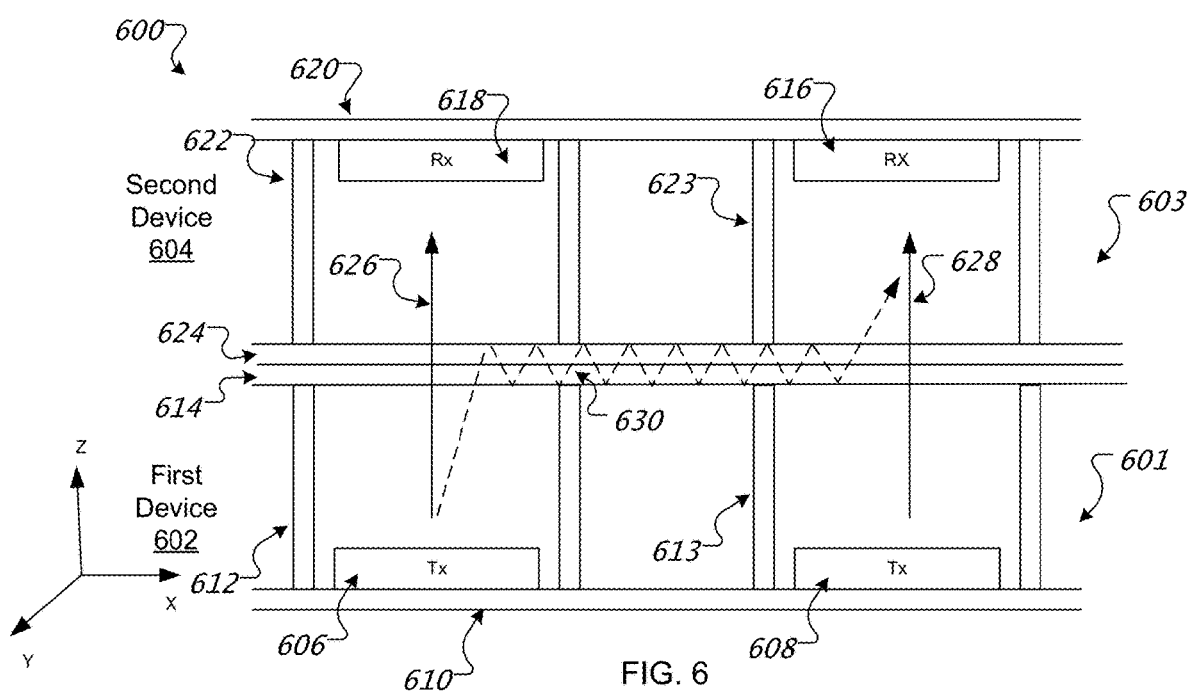
FIG. 6 shows a side view diagram illustrating an example of communication between a pair of communication modules.

FIG. 5A shows a side view diagram 500 illustrating an example of communication between a pair of communication modules. Diagram 500 includes a portion of a first device 502 and a second device 504.

The first device 502 includes a first communication module 501. The first communication module 501 includes a first transmitter IC package 506 and a first receiver IC package 508 mounted to a first PCB 510. In the example shown, each of the first transmitter IC package 506 and the first receiver IC package 508 is encircled by a respective first signal guiding structure 512, 513. The first signal guiding structures 512, 513 each form a channel extending from the respective IC package to a surface of a first housing 514 of the first device 502. For example, the first device 502 can be a first mobile phone and the first housing 514 can correspond to the outer case of the first mobile phone. Alternatively, the first device 502 can be a docking station and the first housing 514 can be the outer housing of the docking station.

As described above, the signal guiding structures can maximize the power of the transmission that is received by the receiver IC package as well as reduce signal leakage. In some alternative implementations, the distance between the IC package and the housing surface is small and a fully encircling signal guiding structure may be unnecessary. Instead, for example, an absorber structure can be positioned between the transmitter and receiver IC packages.

The second device 504 includes a second communication module 503. The second communication module 503 includes a second transmitter IC package 516 and a second receiver IC package 518 mounted to a second PCB 520. Each of the second transmitter IC package 516 and the second receiver IC package 518 is encircled by a respective second signal guiding structure 522, 523. The second signal guiding structures 522, 523 each provide a channel extending from the respective IC package to a surface of a second housing 524 of the second device 502. For example, the second device 502 can be a second mobile phone and the second housing 524 can correspond to the outer case of the second mobile phone. The second device 504 can be a laptop and the second housing 524 can be the outer case of the laptop.

As shown in FIG. 5A, the first signal guiding structures 512, 513 and the second signal guiding structures 522, 523 are substantially aligned on either side of the respective first and second housings 514, 524. The alignment can assist in decreasing loss from a data transmission 526 from the first transmitter IC package 506 to the second receiver IC package 518 and a data transmission 528 from the second transmitter IC package 516 to the first receiver IC package 508.

As described above, each signal guiding structure is configured to aid in directing radio frequency (RF) signals as well as to reduce interference from signals. The signal guiding structure can at least partially surround a perimeter of the IC package and extend in the direction of signal transmission and/or reception by a specified "height" amount to provide a channel for emitted or received RF signals. The signal guiding structure can be composed of a suitable material that is configured to reduce extraneous signals without disrupting passage of communications along the channel formed by the signal guiding structure. The guiding structure may be in part dielectric, conductive and/or absorbing material. Lensing type structures can be built as part of an interior surface of the case. Even with the signal guiding structures, the potential for unintended coupling between channels can occur. Unintended coupling can occur when signals transmitted by a transmitter IC package are received by unintended receivers. Due to the nature of the electromagnetic field generated by the transmitted signals, particularly at certain frequencies, some signals emitted from the first transmitter IC package 506 and intended for the second receiver IC package 518 can propagate to an adjacent channel, for example, the first receiver IC package 508.

Transmitter IC package and receiver IC package pairs form contactless connectors between the first device 502 and the second device 504. The contactless connectors are covered by the device housing (i.e., first housing 514 and second housing 524). The device housing can be device cases that are made of plastic.

For example, as shown in FIG. 5A, the signal guiding structures 512 and 513 extend to the housing 514 of the first device 502. The respective housings have a thickness that results in a gap having a thickness that is the sum of the thicknesses of the first housing and the second housing between the corresponding signal guiding structures along the transmission path. Additionally, the housing may be formed of a material that facilitates propagation of EM signals, e.g., a dielectric material. In addition, the dielectric material of the housing can serve as a waveguide for the signal. As a result, signals can propagate through the first housing 514 and/or the second housing 524, bypassing the signal guiding structures 512, 513, as illustrated by dashed line 530. The signals can then be received by the first receiver IC package 508. This can lead to parasitic signals caused by interference, which are also known as cross-talk between connector lanes. One connector lane can be, for example, the transmission of signal 526 from the transmitter IC package 506 of the first device 502 to receiver IC package 518 of the second device 504. A second connector lane can be, for example, the transmission of signal 528 from the transmitter IC package 516 of the second device 504 to receiver IC package 508 of the first device 502. The cross-talk provided by signal leakage through the device housings and PCB can cause coupling between the first transmitter IC package 506 to the first receiver IC package 508.

Additionally, signals can propagate through the first PCB 510 where the signals can be received by the first receiver IC package 508, as illustrated by dashed line 532.

Figure 5B:
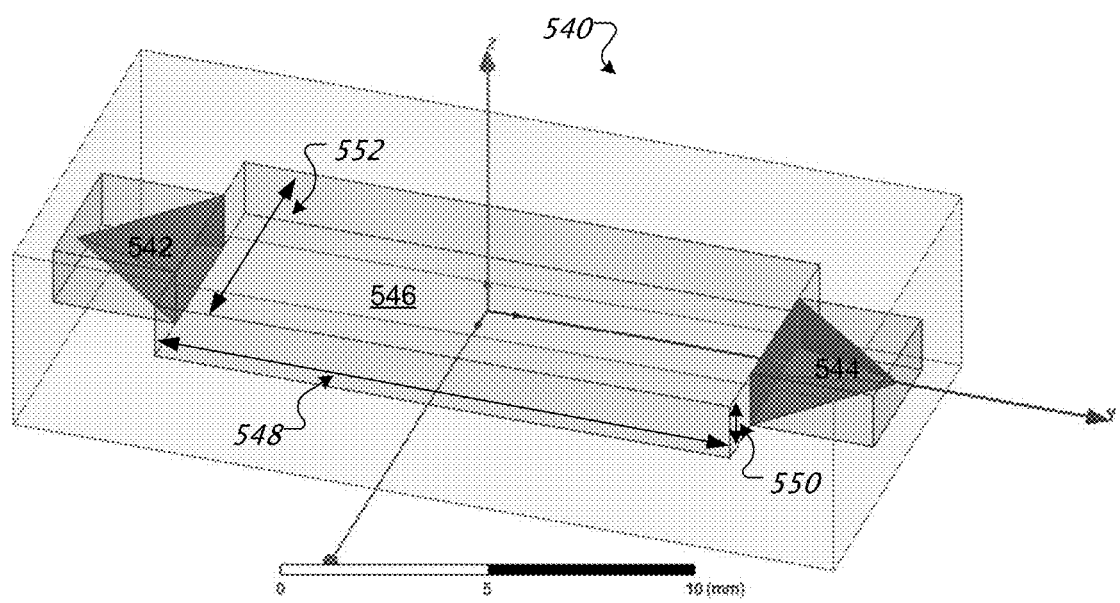
FIG. 5B shows a model system that includes a pair of communication modules.

FIG. 5B shows an example model system 540 having a first transmitter IC package 542 and a first receiver IC package 544 in the same device. For example, FIG. 5B can represent at test structure designed to illustrate signal propagation. A portion of a housing 546 laterally separates the first transmitter IC package 542 from the first receiver IC package 644. In comparison to the first device 502 shown in FIG. 5A, the model 540 simplifies the system by not introducing a vertical displacement in the z direction between the receiver IC package/transmitter IC package and the housing 546, which corresponds to the housing 514 in FIG. 5A.

Examples of system parameters used in the computation of the reflection and transmission coefficients plots can include: a distance 548 between the receiver IC package 544 and the transmitter IC package 542, a depth 552 of the housing 546, a thickness 550 of the housing 546, the permittivity of the material (e.g., plastic) of the housing 546 and a loss tangent measured internally at 60 GHz. The loss tangent quantifies dielectric loss of a dielectric material's inherent dissipation of electromagnetic energy, for example, by heat. The values used here reflect that of an exemplary embodiment.

Besides parasitic propagation of signals internally within a device, FIG. 6 shows a side view diagram 600 illustrating a second example of communication between a pair of communication modules, in which signals from a transmitter of a first device are received by a receiver in an adjacent channel of a second device.

Diagram 600 includes a portion of a first device 602 and a second device 604. The first device 602 includes a first communication module 601. The first communication module 601 includes a first transmitter IC package 606 and a second transmitter IC package 608 mounted to a first PCB 610. Each of the first transmitter IC package 606 and the second transmitter IC package 608 is at least partially encircled by a respective first signal guiding structure 612, 613 similar to the signal guiding structures described above. The first signal guiding structures 612, 613 each form a channel extending from the respective IC package to a surface of a first housing 614 of the first device 602. For example, the first device 602 can be a first mobile phone and the first housing 614 can correspond to the outer case of the first mobile phone. The first device 602 can also be a docking station and the first housing 614 can correspond to an external casing of the docking station.

The second device 604 includes a second communication module 603. The second communication module 603 includes a first receiver IC package 616 and a second receiver IC package 618 mounted to a second PCB 620. Each of the first receiver IC package 616 and the second receiver IC package 618 is at least partially encircled by a respective second signal guiding structure 622, 623. The second signal guiding structures 622, 623 each provide a channel extending from the respective IC package to a surface of a second housing 624 of the second device 602. For example, the second device 602 can be a second mobile phone and the second housing 624 can correspond to the outer case of the second mobile phone. The second device 602 can also be a laptop and the second housing 624 can be the housing of the laptop.

Unintended coupling of signals can also occur between communication modules. In particular, while signals transmitted by the first transmitter IC package 606 are intended for receipt by the first receiver IC package 616, some signals emitted from the first transmitter IC package 606 may be received by the second receiver IC package 618 of the second device 604. In particular, signals can propagate through the first housing 614 and/or the second housing 624, bypassing the first signal guiding structures 612, 613 and second signal guiding structures 622, 623. Once again, the housing (614 and/or 624) can serve as a waveguide for the signals emitted from transmitter IC package 606, as shown by a dotted line 630. As a result, the cross-talk provided by signal leakage through the device housings can cause unintended coupling between the first transmitter IC package 606 of the first device 602 with the second receiver IC package 616 of the second device 604.

Structures for Reducing Cross-Talk

The example shown in FIGS. 5B and 5C can be considered a baseline of signal leakage. The following figures describe the use of additional structures that can reduce this level of signal leakage to provide improved data communication.

Figure 7A:
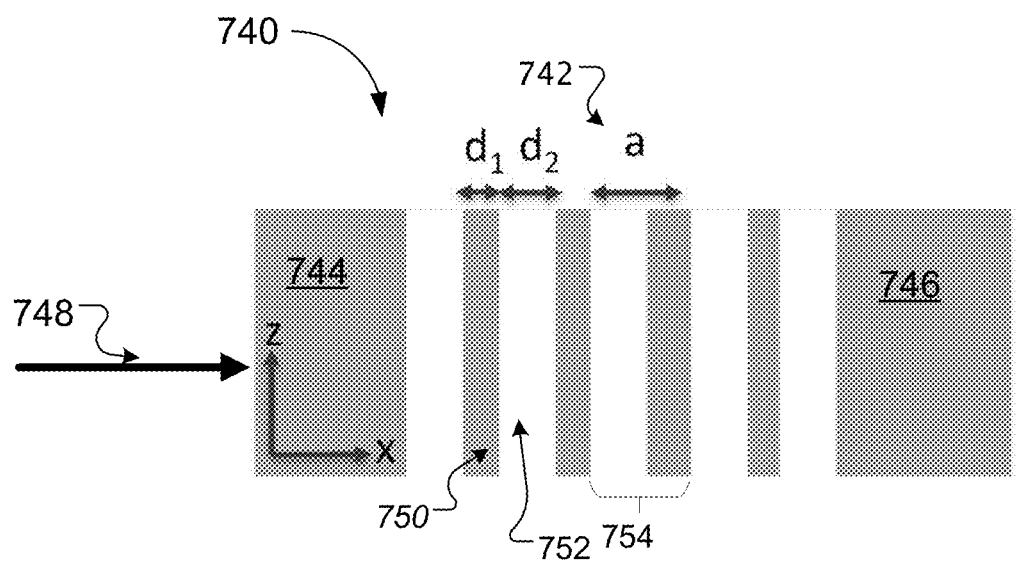
FIG. 7A shows a schematic diagram of a series of structures between two communication modules.

FIG. 7A shows a schematic diagram of structures 742 that reduce or block the parasitic signals from propagating between a first portion 744 of a housing 740 to a second portion 746 of the housing 740, after a signal 748 is incident (e.g., normally, as shown in FIG. 7A, or obliquely (not shown)) on the first portion 744. The structures 742 are formed from a series of alternating first material 750 and second material 752. The first material 750 may be the same material as the housing 740, and the second material 752 is a different material from the first material 750. The first material 760 of the structures 742 can have a width $d_1$ and the second material 752 of the structures 742 can have a width $d_2$. The total width of one unit of the first material 750 and the second material 752 is a. The structures 742 can be a periodic structure of repeating units 754, each having a width a. In other words, the first material 750 within structures 742 can have a uniform width of $d_1$ and the second material 752 within structures 742 can have a uniform width of $d_2$. Alternatively, the arrangement of the structures can be non-periodic (i.e., the widths of either the first material or the second material may deviate within one or more portions of the structures 742.) When the structures are not fully periodic, they generally broaden the effective frequency range at the expense of reducing the magnitude of the effect.

Perturbing the housing 740, which is formed of a first material (e.g., plastic), by replacing selected portions of the housing 740 with a second material having a different permittivity (e.g., alumina) prevents or reduces the propagation of the signal 748 inside the housing 740. In other words, the second material (and the intervening first material) can act as a filter. The second material in the selected portions of the housing can be arranged in a periodic fashion. The second material can be formed in shapes such as circular, rod-shaped, or the second material can be formed in trenches or groves defined within the first material.

Figure 7B:
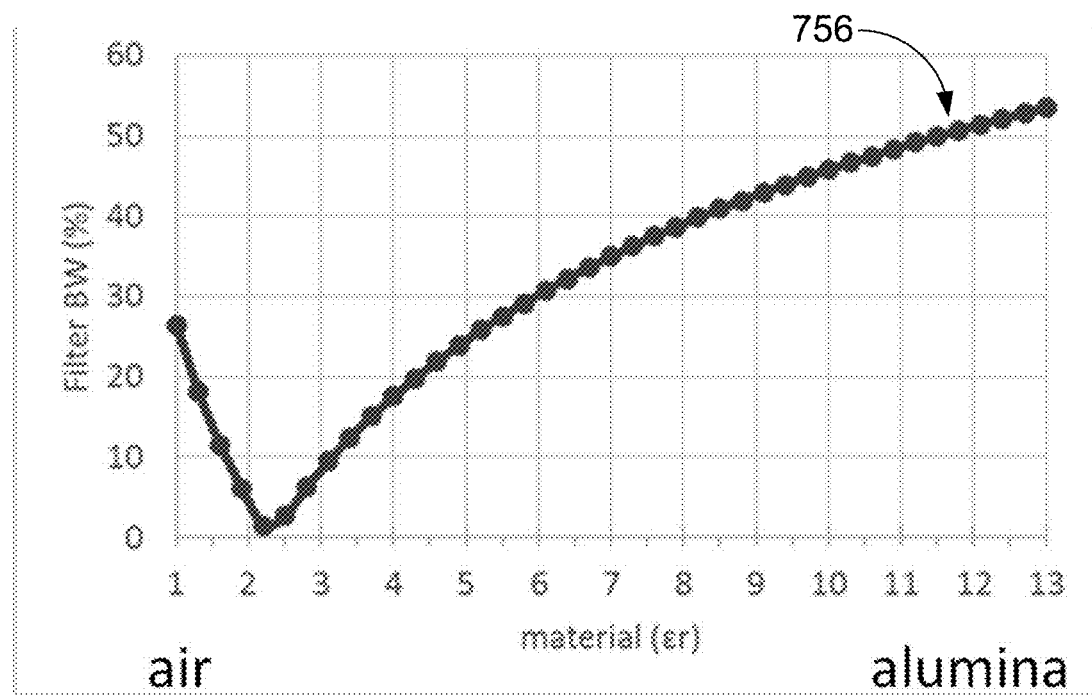
FIG. 7B shows a plot of a bandwidth of a filter as a function of relative permittivity.

The signal 748 transmitted through the structures 742 to the second portion 746 of the housing 740 can be compared with the signal 748 propagating in the first portion 744 of the housing. The structures 742 act as filters when they reduce or block the signal 748 from being transmitted to the second portion 746. FIG. 7B shows a plot 756 of the filter bandwidth (in percent) as a function of the permittivity of the second material 752.

The width $d_1$ of the first material 750 can be a quarter of a wavelength of the signal 748 in the first material. The wavelength of the signal in the material is the free-space wavelength divided by the dielectric constant (or permittivity) of the material. Because the material of the first material 750 (and of the housing 740) is about 2.35, the plot 756 shows a dip to 0% filter bandwidth when the second material 752 also has a permittivity of 2.35. Such a situation is equivalent to a continuous piece of housing 740 that is made of a single uniform material, in which case, no filtering effect is provided. Instead, the housing 740 can additionally act as a dielectric waveguide to guide the signal 748 from the first portion 744 to the second portion 746, resulting in a filter bandwidth of 0%.

Material can be removed from the housing 740 such that the structures are formed with a second material 752 that is simply air. Air has a relative permittivity ($\varepsilon_r$), or dielectric constant, of 1, and the structures 742 in this case provide a filter having a bandwidth of 28%. Plot 756 is independent of frequency. Since the bandwidth is plotted as a % of the signal frequency, it is what is called a normalized quantity. For example, if the transmitted frequency is 50 GHz, choosing a material with a dielectric constant of 5 would yield a bandwidth of 0.25×50 GHZ, or about 12.5 GHz. The effect of the periodic structure is multiplicative, the shape of the bandpass multiplied by the original bandpass. The structures are designed to be a band-stop filter for blocking a range of frequencies. As the dielectric constant of the second material 752 increases from 1 to match that of the first material 750 (2.35), the filter bandwidth decreases. When the permittivity of the second material 752 increases above 2.35, the filter bandwidth increases again. Alumina has a high dielectric constant of between 9.3-11.5, and the filter bandwidth is above 42% over that range. The plot 756 shows that crosstalk between the transmitter IC package 706 and a receiver IC package 708 can be reduced (e.g., significantly attenuated) when a series of structures are introduced into the housing. The filtering effect accumulate for a number of structures in the series, and this affects the depth of the filter response. One element might block 50% (3 dB) of the unwanted propagating signal. Two would block approximately 6 dB (0.5*0.5). The effect is cumulative but, because the signal is also spreading, not exactly multiplicative.

Figure 7C:
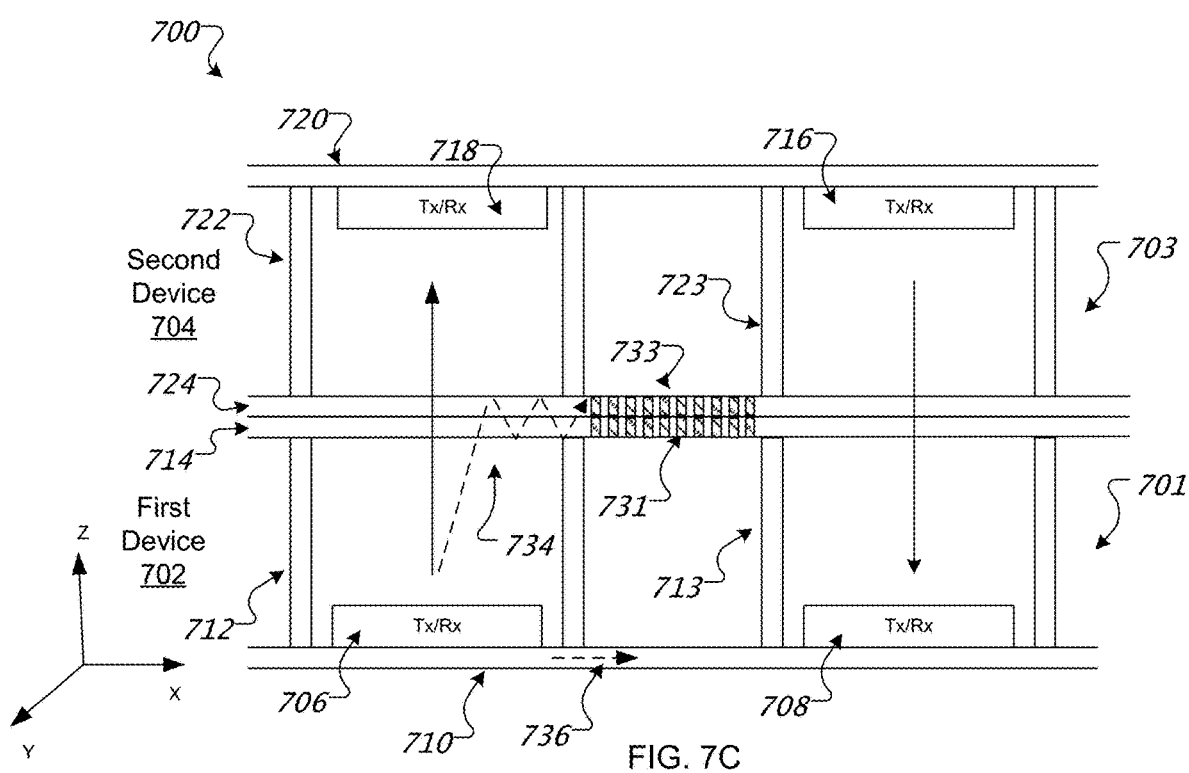
FIG. 7C shows a side view diagram illustrating a pair of communication modules including a signal blocking structure.

FIG. 7C shows a side view diagram 700 illustrating a pair of communication modules including structures for reducing or blocking parasitic signal transmission between or within the communication modules.

Diagram 700 includes a portion of a first device 702 and a second device 704. The first device 702 includes a first communication module 701. The first communication module 701 includes a first transceiver IC package 706 and a second transceiver IC package 708 mounted to a first PCB 710. Each of the first transceiver IC package 706 and the second transceiver IC package 708 is at least partially encircled by a respective first signal guiding structure 712, 713 similar to the signal guiding structures described above.

The first signal guiding structures 712, 713 each form a channel extending from the respective transceiver IC package to a surface of a first housing 714 of the first device 702. For example, the first device 702 can be a first mobile phone and the first housing 714 can correspond to the outer case of the first mobile phone. Only a top portion of the first housing 714 is shown in FIG. 7C. The top portion is supported by a rim portion (not shown). In some embodiments, the first signal guiding structures 712 can serve as part of the rim portion used to support the top portion of the first housing. Alternatively, a different rim portion is used to provide mechanical structural support to the top portion of the housing 714.

The first device 702 further includes structures 731. Structures 731 are similar to those shown in FIG. 7A. The structures 731 are spatially positioned adjacent to first housing 714 and between the channels formed by the first signal guiding structures 712 and 713. The structures 731 are formed within the first housing 714. The structures 731 can be embedded within the first housing. Even though FIG. 7C shows the structures 731 extending through the entire thickness of the first housing 714, the structures 731 can extend vertically only partially through a portion of the thickness of the first housing 714 (e.g., half the thickness of the first housing 714, a quarter of the thickness of the first housing). In some other implementations, the spatial position of the structures 731 can be any suitable position within the electromagnetic field generated by signals leaking from the first transceiver IC package 706 toward the second transceiver package 708.

The second device 704 includes a second communication module 703. The second communication module 703 includes a third transceiver IC package 716 and a fourth transceiver IC package 718 mounted to a second PCB 720. Each of the third transceiver IC package 716 and the fourth transceiver IC package 718 is at least partially encircled by a respective second signal guiding structure 722, 723. The second signal guiding structures 722, 723 each provide a channel extending from the respective transceiver IC package to a surface of a second housing 724 of the second device 704. For example, the second device 704 can be a second mobile phone and the second housing 724 can correspond to the outer case of the second mobile phone.

Alternatively, the second device 704 can be a laptop, and the first device 702 can be a docking station. Only a top portion of the first housing 724 is shown in FIG. 7C. The top portion is supported by a rim portion (not shown). In some embodiments, the second signal guiding structures 722 and 723 can serve as part of the rim portion used to support the top portion of the first housing. Alternatively, a different rim portion is used to provide mechanical structural support to the top portion of the second housing 724.

The second device 704 further includes structures 733. The structures 733 are spatially positioned adjacent to second housing 724 and between the channels formed by the second signal guiding structures 722 and 723. Similar to the structures 731, in some implementations, the structures 733 are formed at least partially within second housing 724. Even though FIG. 7C shows the structures 733 extending through the entire thickness of the second housing 724, the structures can extend vertically only partially through a portion of the thickness of the second housing 724 (e.g., half the thickness of the second housing 724, a quarter of the thickness of the second housing 724).

For convenience, each IC package is referred to as a transceiver IC package. Each transceiver IC package can also be called a connector. In particular implementations, the transceiver IC package may instead be a transmitter IC package, a receiver IC package, or may be an IC package configured to operate selectively as a transmitter or receiver. Thus, the transceivers can correspond to the paired transmitter IC packages and receiver IC packages of either FIG. 5A or 6.

Structures 731, 733 are configured to disrupt an electromagnetic field associated with signals propagating across channels of the communication modules 701, 703, illustrated by dashed path 734 showing propagation through one or more device housing and dashed path 736 showing propagation of signals through the PCB 710.

Figure 7D:
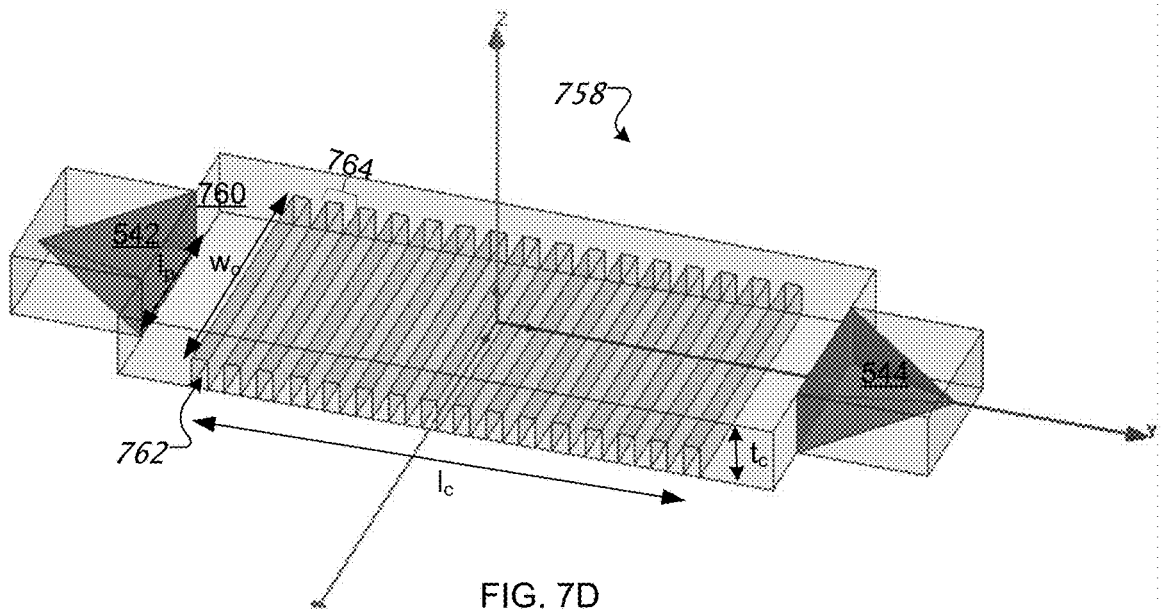
FIG. 7D shows a model system that includes a series of structures between two communication modules.

FIG. 7D shows a model 758, which is similar to the model 540 shown in FIG. 5B, except for a series of corrugations or structures 762 that populates a portion $l_c$ of the housing 760. In the embodiment shown in FIG. 7D, $l_c$ is 75% of the length of the housing 750, which can also the distance between the transmitter and receiver IC packages 542 and 544. The total number of corrugations or structures 762 within $l_c$ is $N_g$. In the embodiment shown in FIG. 7D, there are 16 corrugations or structures (i.e., $N_g$=16). The height of the structure 762 is half of the thickness $t_c$ of the housing 760, and a length of the structure 762 is $w_c$. The volume of a repeating unit 754 is $l_c/N_g \times t_c/2 \times w_c$. $l_p$ is the length of the transmitter or receiver IC package, which has a pyramid shape in the model 768 shown in FIG. 7D. $l_p$ is maintained as a constant in the model and is used for calibration purposes.

Figure 7E:
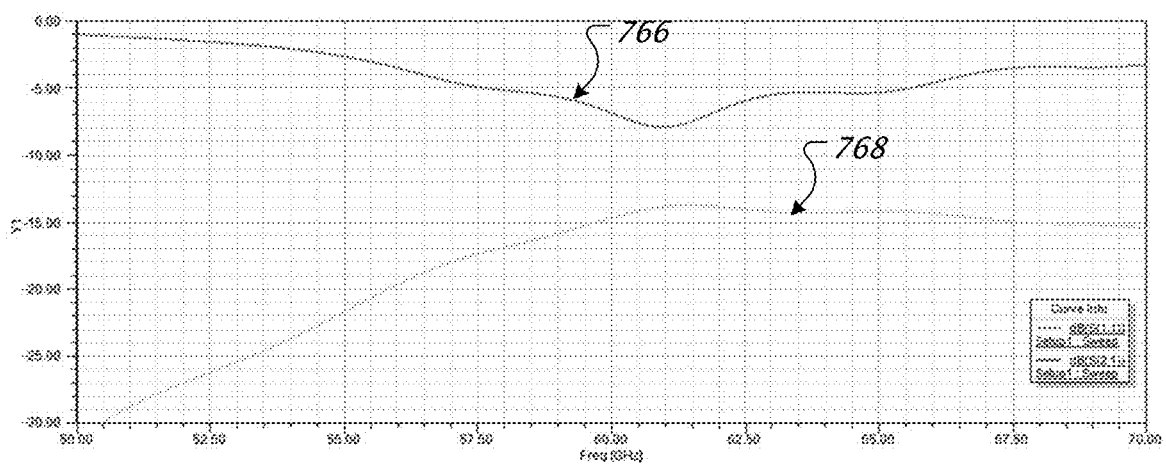
FIG. 7E shows plots of reflection coefficient and transmission coefficient for the model system shown in FIG. 7D as a function of frequency.

FIG. 7E shows a plot 766 of the reflection coefficient S11 between the frequency of 50 GHz to 70 GHz for one embodiment of the model 768 shown in FIG. 7D. Compared to the plot 560 in FIG. 5C for an unperturbed housing having no second material, the presence of the 16 corrugations or structures 762 shifts the minimum of the reflection coefficient S11 (~−8 dB) from 60 GHz in FIG. 5C to about 61 GHz. The maximum of the transmission coefficient S21 drops from −12 dB in FIG. 5C to about −14 dB in FIG. 7E, due to the presence of the 16 structures 762.

Figure 8:
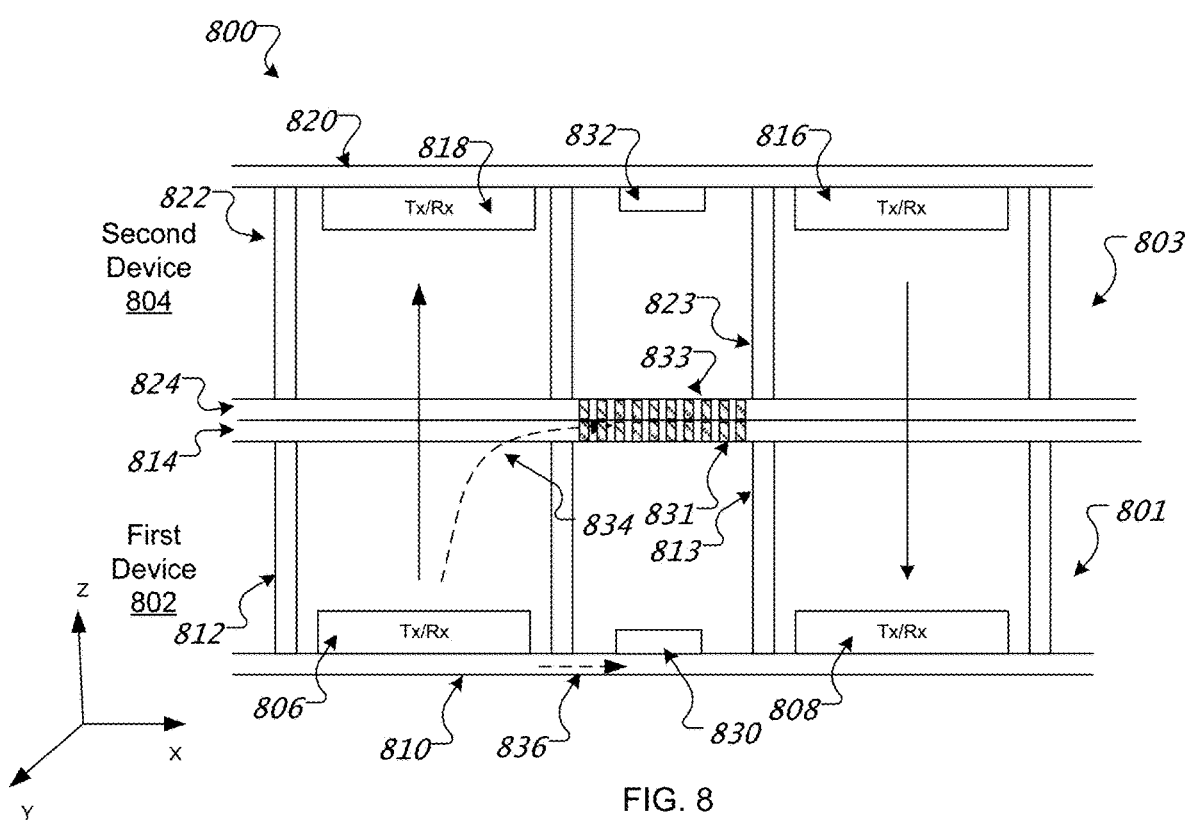
FIG. 8 shows a side view diagram illustrating a pair of communication modules including a signal blocking structure.

FIG. 8 shows a side view diagram 800 illustrating a pair of communication modules including a signal blocking structure and structures for reducing or blocking parasitic signal transmission between or within the communication modules.

Diagram 800 includes a portion of a first device 802 and a second device 804. The first device 802 includes a first communication module 801. The first communication module 801 includes a first transceiver IC package 806 and a second transceiver IC package 808 mounted to a first PCB 810. Each of the first transceiver IC package 806 and the second transceiver IC package 808 is at least partially encircled by a respective first signal guiding structure 812, 813 similar to the signal guiding structures described above.

The first signal guiding structures 812, 813 each form a channel extending from the respective transceiver IC package to a surface of a first housing 814 of the first device 802. For example, the first device 802 can be a first mobile phone and the first housing 814 can correspond to the outer case of the first mobile phone.

The first device 802 further includes a first blocking structure 830 in addition to the structures 831, which are similar to structures 731 shown in FIG. 7C. The first blocking structure 830 is spatially positioned adjacent to the first PCB 810 and between the channels formed by the first signal guiding structures 812 and 813.

The second device 804 includes a second communication module 803. The second communication module 803 includes a third transceiver IC package 816 and a fourth transceiver IC package 818 mounted to a second PCB 820. Each of the third transceiver IC package 816 and the fourth transceiver IC package 818 is at least partially encircled by a respective second signal guiding structure 822, 823.

The second signal guiding structures 822, 823 each provide a channel extending from the respective transceiver IC package to a surface of a second housing 824 of the second device 802. For example, the second device 802 can be a second mobile phone and the second housing 824 can correspond to the outer case of the second mobile phone.

The second device 804 further includes a second blocking structure 832 in addition to the structures 833, which is similar to structures 733 shown in FIG. 7C. The second blocking structure 832 is spatially positioned adjacent to the second PCB 820 and between the channels formed by the second signal guiding structures 822 and 823.

The blocking structures 830 and 832 can be formed from a material that absorbs electromagnetic radiation, particularly radio frequency electromagnetic radiation including EHF RF electromagnetic radiation. For example, the blocking structure can be composed of a silica-ferrite material, e.g., a material formed by mixing small iron pieces with silicon. In some implementations, an epoxy based ferrite material could be used as a blocking structure having a suitable heat tolerance. Other absorbing materials can be used to form the blocking structure, for example, other ferrite materials or carbon based materials.

The dimensions of the blocking structure can depend on the material used and the dimensions of the communication module, e.g., the spacing between channels or the width of the IC packages. Additionally, the size of the blocking structure can depend on the wavelength of the electromagnetic signals. For example, the blocking structures may extend towards the housing and in some cases may be in contact with the housing or even extend through the housing.

Because the leaking signals are part of an electromagnetic field, propagation can be significantly disrupted even without the blocking structure being directly in a line of sight path of propagation of the signal. Thus, if a first blocking structure 830 is positioned adjacent to the first housing 814, the blocking structure is able to disrupt propagation both through the first housing 814 and the first PCB 810.

Use of the blocking structure 830/832 and structures 831 and 833 can reduce cross-talk generated by unintended coupling. For example, in some implementations, cross talk caused by the unintended coupling can be reduced by up to 10 dB relative to the cross talk without the signal blocking structure. Reducing cross-talk can improve performance of communications between paired transmitter and receiver IC packages. In some implementations, the reduction in cross-talk can also reduce leakage from the device to outside where they might cause interference with other devices. This reduction in outside leakage can be beneficial to satisfying various regulatory requirements for devices.

Additionally, in some implementations, the presences of the structures 831 and 833 between communication channels can reduce the need for other absorbers such as an absorber that surrounds the signal guiding structures.

As above, each IC package is referred to as a transceiver IC package for convenience. In particular implementations, the transceiver IC package may instead be a transmitter IC package, a receiver IC package, or may be an IC package configured to operate selectively as a transmitter or receiver.

Similar to the signal blocking structures described above with respect to FIG. 7, each of the first and second blocking structures 830, 832 are configured to disrupt an electromagnetic field associated with signals propagating across channels of the communication modules 801, 803, illustrated by dashed path 834 showing propagation through one or more of the device housings and dashed path 836 showing propagation of signals through the PCB 810.

As described above, propagation can be significantly disrupted even without being positioned directly in a line of sight path between the channels. Thus, although the first blocking structure 830 is positioned adjacent to the first PCB 810, the blocking structures are able to disrupt propagation both through the housing and the first PCB 810 as shown by paths 834 and 836.

FIG. 8 shows an example position for signal blocking structures. However other suitable positions can be used. For example, the signal blocking structure can be positioned at a point between the PCB and the housing, e.g., the signal blocking structure can be elevated over the PCB surface by a support structure mounted on the PCB or extending from the housing. In some other implementations, the signal blocking structure is partially embedded within a recess formed in the housing or a recess formed in the PCB. In some implementations, the relative position of the blocking structure with respect to the PCB and the housing can affect the degree of cross-talk reduction from the respective sources. For example, positioning the blocking structure closer to the PCB may result in a greater reduction of electromagnetic signals propagating through the PCB than the reduction of electromagnetic signals propagating through the housing. Similarly, positioning the blocking structure closer to the housing may result in a greater reduction of electromagnetic signals propagating through the housing than the reduction of electromagnetic signals propagating through the PCB. The particular position of the blocking structure can be selected, for example, to optimize the reduction overall or to optimize the reduction from a particular source path, e.g., through the PCB.

Figure 9:
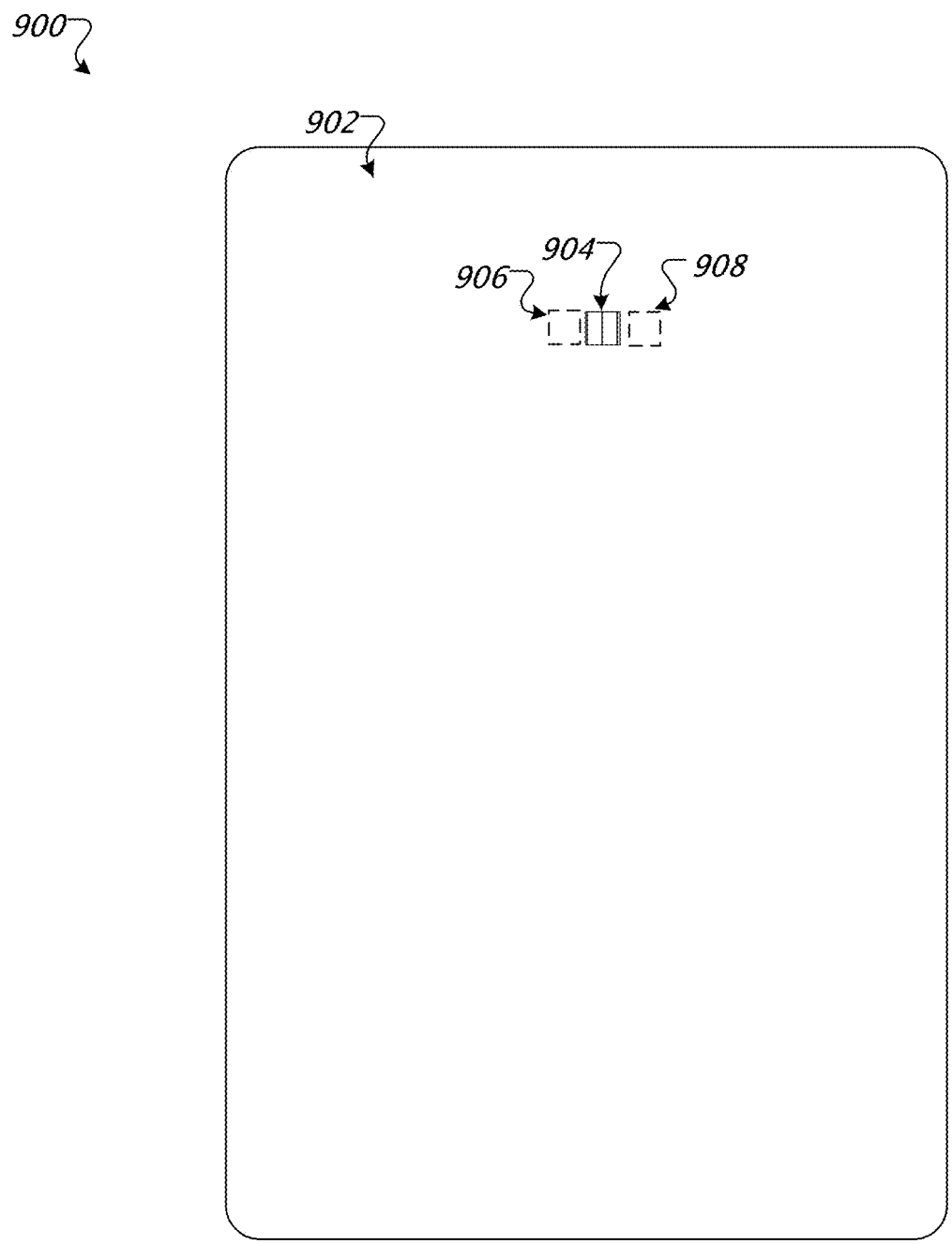
FIG. 9 shows a top view of a device housing incorporating a series of structures.

FIG. 9 shows a view 900 of a device housing portion 902 incorporating a number of structures 904. The device housing portion 902 can be, for example, a portion of a device case e.g., for a mobile phone, tablet device, or laptop. In particular, view 900 can represent an interior portion of the device case.

The structures 904 can be formed by removing material from the device housing portion 902 and re-filling voids defined in the device housing portion 902 with a second material. In this way, the exterior surface of the device housing portion 902 can be kept smooth and/or planar, without dents or bumps. Alternatively, the device housing portion 902 can be doped at selected location to the desired structures having a difference dielectric constant from the device housing 902. The doped material can also be foam. "Doping" is consistent with common usage in semiconductor physics. In this case, it can include secondary insert molding or equivalent. In addition, the device housing portion 902 can also be produced using other suitable techniques, for example, by 3D printing in which the housing portion 902 can be fabricated to include structures of a second material arranged at specific locations. Various patterns for distributing structures 904 within the device housing portion 902 can be defined through a molding process such as injection molding. Using such a method, the housing will be formed integrally and at the same time as the structures. The structures 904 are positioned such that when the housing portion 902 is positioned over a communication module, the structures 904 are located between the channels of a pair of transceiver IC packages, represented by dashed boxes 906 and 908.

Figure 10A:
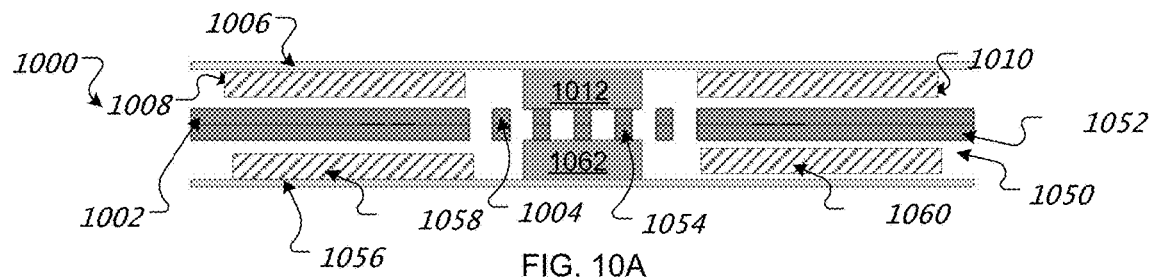
FIG. 10A shows a side view diagram of a communication module incorporating a series of structures.

FIG. 10A shows a side view of a first device 1000 having a first housing 1002 that incorporates a number of structures 1004. The first device 1000 includes a PCB 1006. Positioned on PCB 1006 are a first transceiver IC package 1008 and a second transceiver IC package 1010. The structures 1004 are positioned between the two channels formed by each of the first transceiver IC package 1008 and the second transceiver IC package 1010. In addition, an absorber 1012 (e.g., a blocking structure like those described with respect to FIG. 8) can be positioned on the PCB 1006. The first device 1000 is placed in close proximity to a second device 1050 having a second housing 1052 that incorporates a number of structures 1054. The second device 1050 includes a PCB 1056. Positioned on PCB 1056 are a third transceiver IC package 1058 and a fourth transceiver IC package 1060. The structures 1054 are positioned between the two channels formed by each of the third transceiver IC package 1058 and the fourth transceiver IC package 1060. For example, the first transceiver package 1008 and the third transceiver IC package 1058 jointly form the first channel and the second transceiver IC package 1010 and the fourth transceiver IC package 1060 jointly form the second channel. In addition, an absorber 1062 can be positioned on the PCB 1056. For simplicity, signal guiding structures, for example, structures 512, 513, 522, and 523 shown in FIG. 5A are not shown in FIG. 10A. In general, the devices include the signal guiding structures. The signal guiding structures can be eliminated if a distance to the absorber structures is short enough. For example, if the absorber is in direct contact with an interior surface of the case, guiding structures are not needed. In some implementations, such a structure may add unnecessary complexity.

Figure 10B:
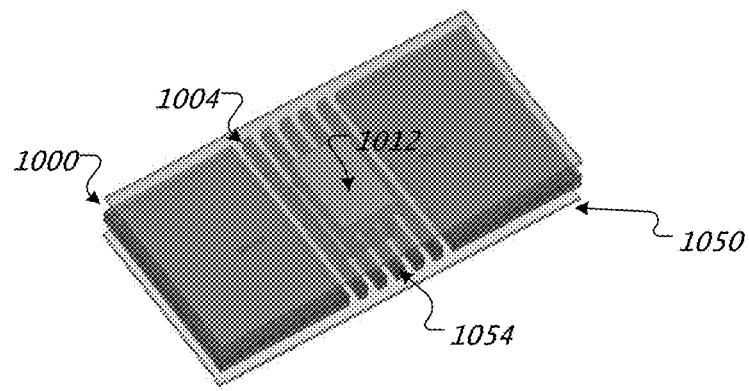
FIG. 10B shows a top view of a communication module incorporating a series of structures.

FIG. 10B shows a top view of the first device 1000 in close proximity to the second device 1100. For simplicity, the transceiver IC packages 1008, 1010, 1058, and 1060 are not shown in FIG. 10B.

Figure 10C:
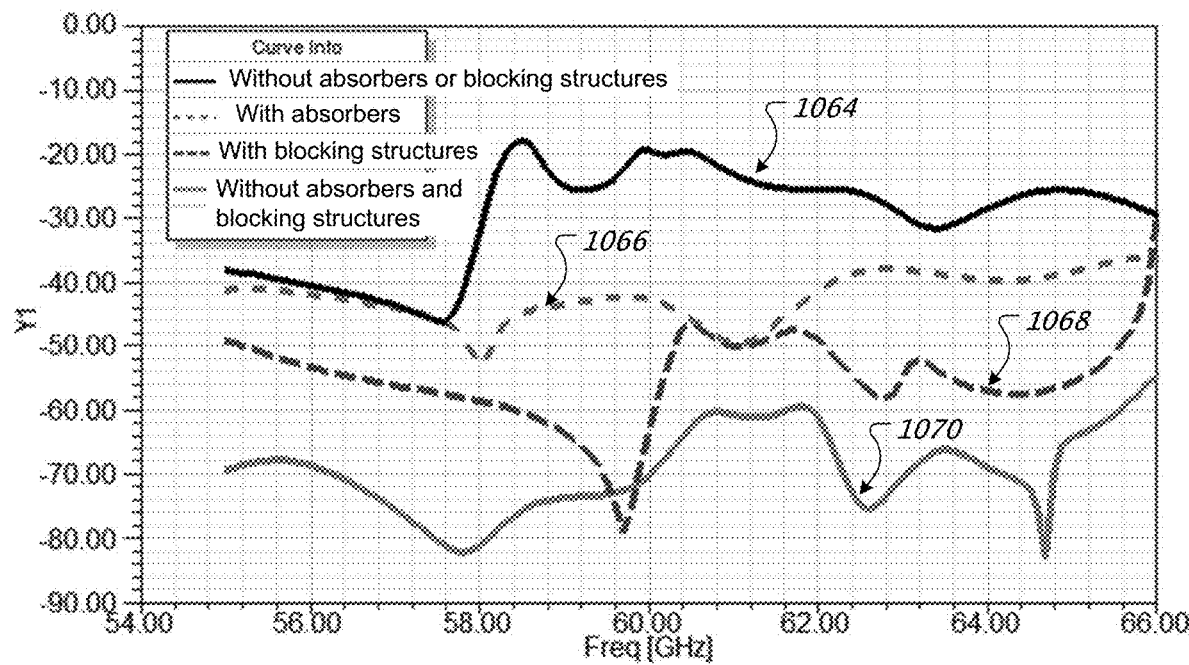
FIG. 10C shows reflection coefficient plots for different systems.
Figure 10D:
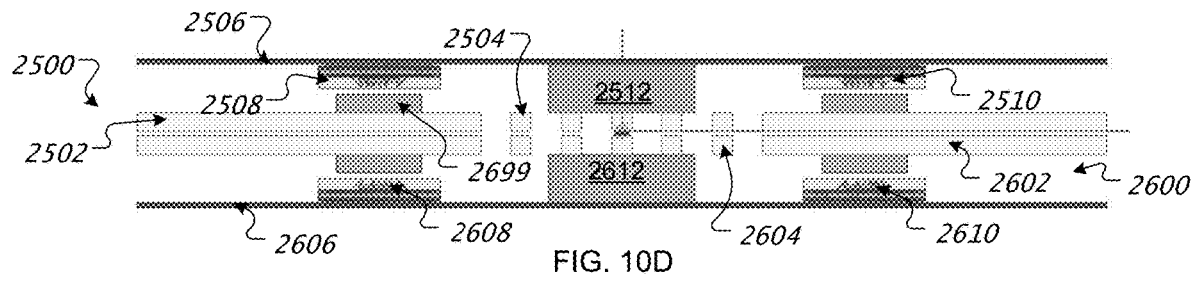
FIG. 10D shows a side view diagram of a communication module incorporating a series of structures.

FIG. 10C shows a plot 1064 of a plot of crosstalk, each curve representing a different degree of suppression. In particular, the transmission coefficient S21 measures the amount of power transmitted by a transmitter IC package on one portion of the housing that is sensed by a receiver IC package on the other portion of the housing. The housing does not include any arrangement of structures (e.g., periodic structures) or absorbers. The units are dB relative to the desired direct signal, S21 for example. They are much lower compared to those shown in FIGS. 7E-7K because, unlike the structures shown in FIGS. 7E-7K, the "unfiltered" original crosstalk is the fraction of the direct signal (straight across) that is diverted along the direction of the case. A plot 1066 shows the transmission coefficient S21 for a housing that includes absorber structures. As can be seen in FIG. 10C, the transmission coefficient S21 is reduced by the presence of the absorbers. A plot 1068 shows the transmission coefficient S21 for a housing that includes a periodic arrangement of structures, similar to structures 1004 and 1054 shown in FIG. 10A. The transmission coefficient S21 is lower when the periodic arrangement of structures are used instead of absorbers. A plot 1070 shows the transmission coefficient when both absorbers and periodic structures are used. The transmission coefficient is lower almost everywhere over the band in this case compared to all plots 1064, 1066, and 1068. Frequency dependence of crosstalk can be due to interactions that involve both constructive and destructive interference. The relevant metric here is the averaged crosstalk, not a single excursion where one curve crosses another. FIG. 10D shows a side view of a first device 2500 having a first housing 2502 that incorporates a number of structures 2504. The first device 2500 includes a PCB 2506. Positioned on PCB 2506 are a first transceiver IC package 2508 and a second transceiver IC package 2510. The structures 2504 are positioned between the two channels formed by each of the first transceiver IC package 2508 and the second transceiver IC package 2510. In addition, an absorber 2512 can be positioned on the PCB 2506. The first device 2500 is placed in close proximity to a second device 2600 having a second housing 2602 that incorporates a number of structures 2604. The second device 2600 includes a PCB 1606. Positioned on PCB 2606 are a third transceiver IC package 2608 and a fourth transceiver IC package 2610. The structures 2604 are positioned between the two channels formed by each of the third transceiver IC package 2608 and the fourth transceiver IC package 2610. For example, the first transceiver package 2508 and the third transceiver IC package 2608 jointly form the first channel and the second transceiver IC package 2510 and the fourth transceiver IC package 2610 jointly form the second channel. In addition, an absorber 2612 can be positioned on the PCB 2606. A dielectric, such as post 2699, may act as a lens and help boost coupling. When the post 2699 is placed in the desired transmission direction, it can help to direct the signal in the correct direction.

Figure 10E:
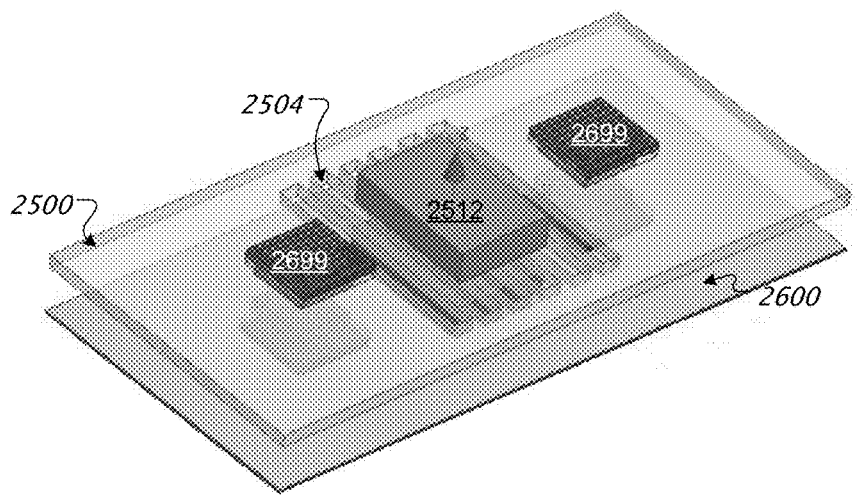
FIG. 10E shows a top view of a communication module incorporating a series of structures.

FIG. 10E shows a top view of the first device 2500 in close proximity to the second device 2600.

The structures defined in the housing of the devices can also be combined with other signal blocking structures to reduce undesirable cross-talk. For example, the periodic structure may work alone or with absorbers.

Figure 11A:
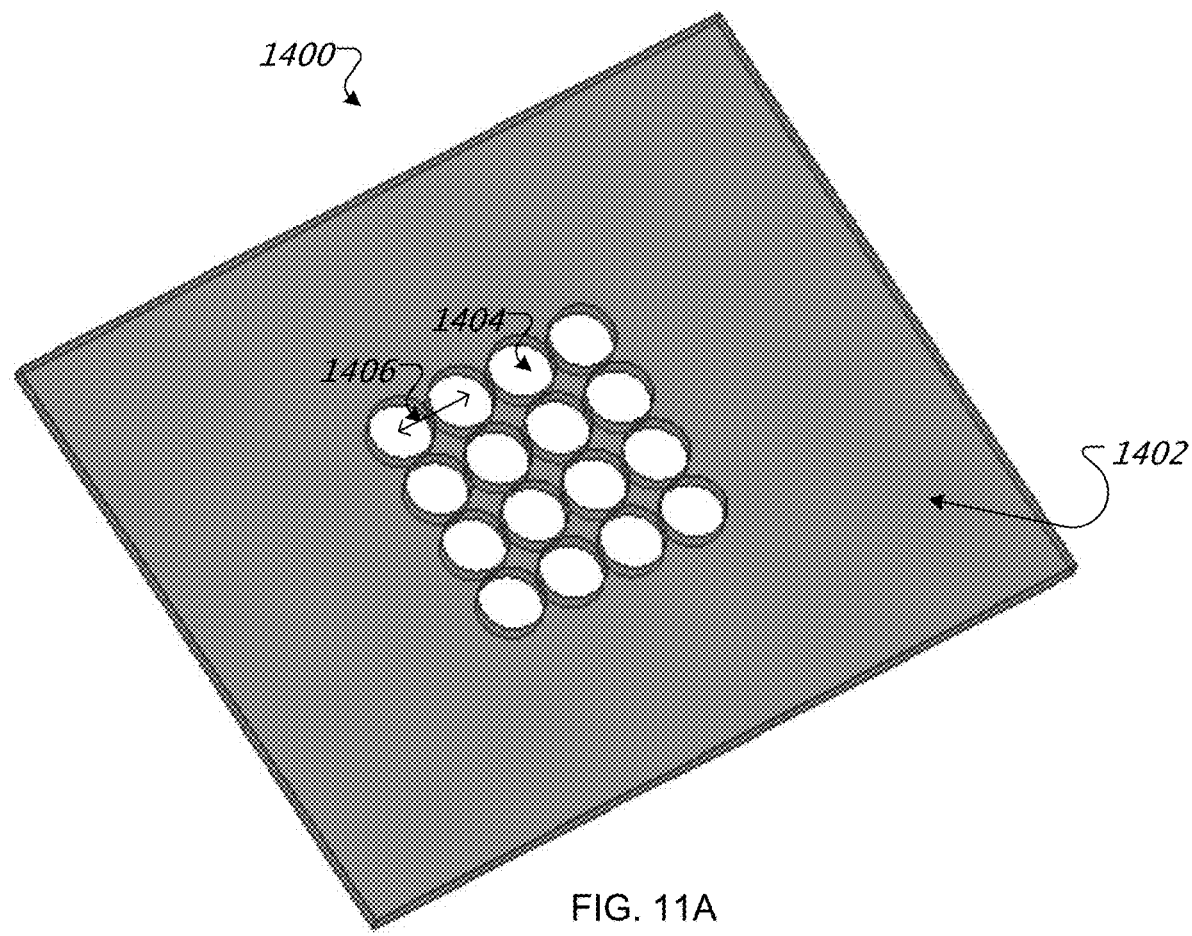
FIG. 11A shows a top view diagram of a series of structures.

FIG. 11A shows a portion 1400 of a housing 1402. Instead of a groove or trench like structure, structures 1404 each having a circular shape can be defined in the housing 1402. Even though the circular shape of structures 1404 shown in FIG. 11A is different from the trench- or groove-shaped structures shown in FIG. 7A. The composition of the material that forms the structures 1404 can be the same as the second material 752 described in FIG. 7A and other figures above. In the embodiment shown in FIG. 11A, the circular structures 1401 have a center-to-center distance 1406 that is constant between adjacent structures. In other words, the structures 1404 shown in FIG. 11A have a regular periodicity. In other embodiments, circular structures can be spaced at irregular intervals from one another, depending on the objectives for the relevant applications.

Figure 11B:
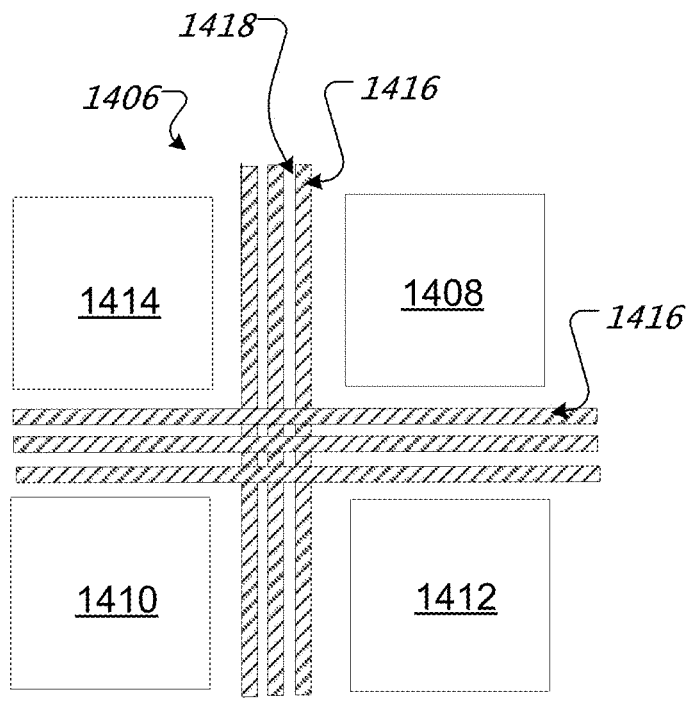
FIG. 11B shows a side view diagram of an arrangement of structures.

Each transceiver IC package can also be referred to as a connector. In general, structures can be placed where signal propagation is undesired, such as between connectors or they may surround connectors. FIG. 11B shows an arrangement 1406 of four transceiver IC packages 1408, 1410, 1412, and 1414. Structures 1416, which are made of a material different from the material of the housing 1418 can be arranged between pairs of connectors as shown in FIG. 11B. The distances between structures 1416 may not be uniform, and the shape of the structures can also differ.

Figure 11C:
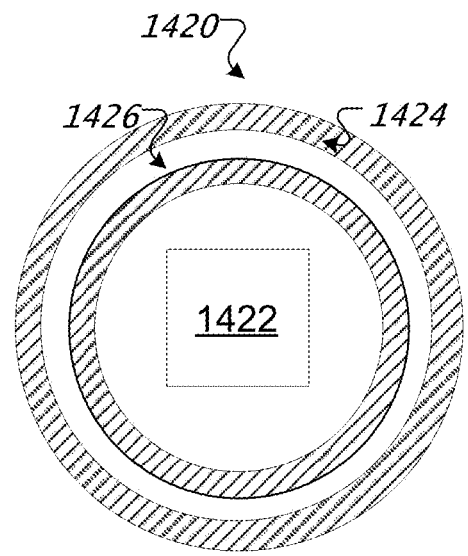
FIG. 11C shows a side view diagram of an arrangement of structures.

FIG. 11C shows an arrangement 1420 of structures 1424 that are arranged in concentric circles around a connector 1422. The structures 1424 are made of a material different from that of the housing 1426. The concentric circles are arranged alternatively between materials of the housing 1426.

Figure 11D:
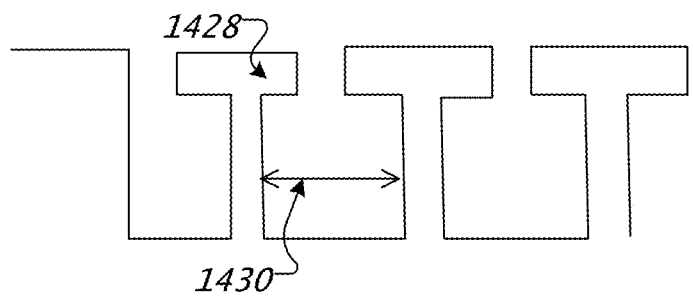
FIG. 11D shows a side view diagram of a series of structures.

FIG. 11D shows structures 1428 that have a T-shape. Other shapes besides circular, groove/trench, rod and T-shape are possible. A distance 1430 between structures 1428 need not be constant. The size of the structures 1428 also need not be constant.

Figure 11E:
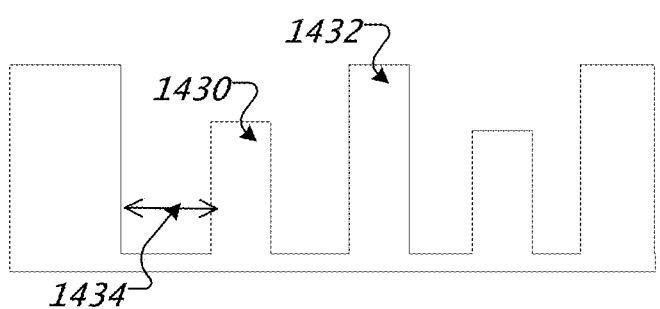
FIG. 11E shows a side view diagram of a series of structures.

FIG. 11E shows an example where structures 1430 and 1432 in the form of grooves have different heights. A distance 1434 between each structures 1430 and 1432 also need not be uniform and may be adjusted according to specific needs. Different geometries weight performance parameters differently. Any filter and gain may be favored over bandwidth or vice versa. In this case, the rejection gain may be stronger at a narrow band with a simpler geometry while bandwidth may be favored over a rejection band with more complicated geometries.

In general, corrugations or groves can be uniform (totally periodic) as shown in FIG. 7C or non-uniform, as shown in FIG. 7A. They can partially or completely penetrate the cover structure, as shown in FIG. 7C and FIG. 7A, respectively. Different groove geometries (number and size) would result in different S11 and S21 values. Better S21 values, such as those lower than −15 dB, demonstrate the enhancement resulting from the groove structures.

The use of structures (e.g., periodic structures having identical repeating units) can help to eliminate the need for absorbers around devices and/or transceiver IC packages. These absorbers can be "picture frame" absorbers that would otherwise surround the devices and/or transceiver IC packages for reducing cross-talk signals. Reducing or eliminating the use of picture frame absorbers can reduce the material volume and free up real estate and lower costs due to the space the materials may take up. For example, an absorber that is arranged to surround the guiding structure may be eliminated when the structures are used. In addition, the material used as to define the structures can be flexibly chosen. For example, the structures can be formed by first removing material from the housing and re-filling the gaps or voids with a second material (e.g., foam, plastics, nylon . . . etc.) to provide a housing having a smooth and/or planar exterior surface. Alternatively, the structures can also be easily implanted within the cases of devices (e.g., plastic cases) for simple integration. Implanting can involve putting the structures in devices. For example, rather than molding the structures directly into the case, the cases may be made with a slot for separately made structures to be inserted therein.

In the example implementations described above, a portion of the housing through which signals pass to or from an IC package of a communication can be formed of a different material than other portions of the housing. For example, in some implementations a portion of the housing can be formed from a metallic material that would inhibit passage of the signals. To allow passage of the signals, a portion of the housing along the signal paths can be formed from another material, for example, an insert of a plastic material that allows signal passage.

A number of embodiments of the invention have been described. Nevertheless, it will be understood that various modifications may be made without departing from the spirit and scope of the invention. Accordingly, other embodiments are within the scope of the following claims.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a sub combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus comprising:
   a communications module comprising two or more integrated circuit packages each integrated circuit package including at least one transmitter, receiver, or transceiver; and
   a device housing portion for an electronic device, wherein the housing portion comprises a planar portion substantially parallel to a communications module of the device, the planar portion of the housing comprising:
   a first region formed from a first material and configured to be in a transmission path of a first electromagnetic signal, associated with a first integrated circuit package, when transmitted to or from the device;
   a second region formed from the first material and configured to be in the transmission path of a second electromagnetic signal, associated with a second integrated circuit package, when transmitted to or from the device; and
   a third region comprising an arrangement of structures formed from a plurality of segments of the first material and a plurality of segments of a second material, wherein the first material has a first dielectric constant that allows propagation of electromagnetic signals and the second material has a second dielectric constant, wherein the arrangement of the first material and the second material provides a bandpass filter of electromagnetic signals.

2. The apparatus of claim 1, wherein the second material is an absorptive material.

3. The apparatus of claim 1, wherein the width of the second material is selected based on a wavelength of the first electromagnetic signal.

4. The apparatus of claim 1, wherein the width of the first material is selected based on a wavelength of the first electromagnetic signal.

5. The apparatus of claim 1, wherein the width of the second material varies through the arrangement of structures to provide a wider frequency range of filtering.

6. The apparatus of claim 1, wherein the magnitude of the electromagnetic signal filtering depends on the number of segments of the second material in the arrangement of structures.

7. The apparatus of claim 1, wherein a thickness of the second dielectric material is less than a thickness of the planar portion of the housing.

8. The apparatus of claim 1, wherein the arrangement of structures comprises a plurality of concentric circles of the first material and the second material, respectively, positioned relative to the first region.

9. The apparatus of claim 1, wherein forming the arrangement of structures comprises removing portions of the planar portion of the housing and filling the removed portions with the second material.

10. An apparatus, comprising:
    a device housing portion for an electronic device, wherein the housing portion comprises a planar portion substantially parallel to a communications module of the device, the planar portion of the housing comprising:
    a first region formed from a first material and configured to be in a transmission path of electromagnetic signals, associated with a corresponding integrated circuit packages, when transmitted to or from the device;
    a second region comprising an arrangement of structures formed from a plurality of segments of the first material and a plurality of segments of a second material, wherein the first material has a first dielectric constant that allows propagation of electromagnetic signals and the second material has a second dielectric constant, wherein the arrangement of the first material and the second material provides a bandpass filter of electromagnetic signals.

11. The apparatus of claim 10, wherein the second material is an absorptive material.

12. The apparatus of claim 10, wherein the width of the second material is selected based on a wavelength of the electromagnetic signals.

13. The apparatus of claim 10, wherein the width of the first material is selected based on a wavelength of the electromagnetic signals.

14. The apparatus of claim 10, wherein the width of the second material varies through the arrangement of structures to provide a wider frequency range of filtering.

15. The apparatus of claim 10, wherein the magnitude of the electromagnetic signal filtering depends on a number of segments of the second material in the arrangement of structures.

16. The apparatus of claim 10, wherein a thickness of the second dielectric material is less than a thickness of the planar portion of the device housing portion.

17. The apparatus of claim 10, wherein the arrangement of structures comprises a plurality of concentric circles of the first material and the second material, respectively, positioned relative to the first region.

18. The apparatus of claim 10, wherein forming the arrangement of structures comprises removing portions of the planar portion of the housing and filling the removed portions with the second material.

* * * * *